(12) United States Patent
Tomida et al.

(10) Patent No.: US 10,079,188 B2
(45) Date of Patent: Sep. 18, 2018

(54) RESIN COMPOSITION FOR ENCAPSULATING, MANUFACTURING METHOD OF ON-VEHICLE ELECTRONIC CONTROL UNIT, AND ON-VEHICLE ELECTRONIC CONTROL UNIT

(71) Applicant: SUMITOMO BAKELITE CO., LTD., Tokyo (JP)

(72) Inventors: Naoki Tomida, Tokyo (JP); Kazuhiko Dakede, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 15/537,088

(22) PCT Filed: Jan. 20, 2016

(86) PCT No.: PCT/JP2016/051593
§ 371 (c)(1),
(2) Date: Jun. 16, 2017

(87) PCT Pub. No.: WO2016/139985
PCT Pub. Date: Sep. 9, 2016

(65) Prior Publication Data
US 2017/0345730 A1    Nov. 30, 2017

(30) Foreign Application Priority Data

Mar. 5, 2015 (JP) .................................. 2015-043851

(51) Int. Cl.
*H01L 23/29* (2006.01)
*B60R 16/02* (2006.01)
(Continued)

(52) U.S. Cl.
CPC ............ *H01L 23/295* (2013.01); *B60R 16/02* (2013.01); *C08K 3/36* (2013.01); *C08K 5/3445* (2013.01);
(Continued)

(58) Field of Classification Search
CPC ... H01L 23/293; H01L 23/295; H01L 23/296; C08K 3/36; C08K 5/3445; C08L 101/12
See application file for complete search history.

(56) References Cited

U.S. PATENT DOCUMENTS 8,262,970 B2 * 9/2012 Morita ................. H01L 21/566
264/272.11
2003/0087992 A1 * 5/2003 Togashi ................ C08G 59/30
523/440
(Continued)

FOREIGN PATENT DOCUMENTS

EP    0379172    *  7/1990  ............. C08L 63/04
JP    10-175210 A    6/1998
(Continued)

OTHER PUBLICATIONS

Translation, Written Opinion of the International Searching Authority, ISA/JP, PCT App. No. PCT/JP2016/051593, dated Mar. 28, 2016, all pages.*
(Continued)

*Primary Examiner* — Victoria K Hall
(74) *Attorney, Agent, or Firm* — Birch, Stewart, Kolasch & Birch, LLP

(57) ABSTRACT

Provided is a resin composition for encapsulating which is used for forming an encapsulating resin of an on-vehicle electronic control unit including a wiring substrate, a plurality of electronic components mounted on the wiring substrate, and the encapsulating resin encapsulating the electronic component, the resin composition including: a
(Continued)

thermosetting resin; and one or more imidazole compounds, in which when a torque value is measured over time under conditions of the number of rotations of 30 rpm and a measurement temperature of 175° C. by using Labo Plastomill, a time $T_1$ at which the torque value is less than or equal to 2 times a minimum torque value is longer than or equal to 15 seconds and shorter than or equal to 100 seconds, and the minimum torque value is greater than or equal to 0.5 N·m and less than or equal to 2.5 N·m.

14 Claims, 2 Drawing Sheets

(51) Int. Cl.
  *C08K 3/36*   (2006.01)
  *C08K 5/3445*   (2006.01)
  *C08L 101/00*   (2006.01)
  *H05K 3/28*   (2006.01)
  *C08L 101/12*   (2006.01)
  *H01L 23/31*   (2006.01)

(52) U.S. Cl.
  CPC ........... *C08L 101/00* (2013.01); *C08L 101/12* (2013.01); *H01L 23/293* (2013.01); *H05K 3/28* (2013.01); *H01L 23/3107* (2013.01)

(56) References Cited

U.S. PATENT DOCUMENTS

2006/0189721 A1*   8/2006   Akiyama ............. C08G 59/621
                               523/400
2011/0089549 A1*   4/2011   Zenbutsu .............. H01L 21/565
                               257/676
2013/0026660 A1   1/2013   Czubarow et al.
2015/0115311 A1*   4/2015   Yoshida .................. B29C 43/18
                               257/100

FOREIGN PATENT DOCUMENTS

| JP | H11-323097 | * | 11/1999 | .............. C08L 63/00 |
|---|---|---|---|---|
| JP | 11-333834 | A | 12/1999 | |
| JP | 2001-278948 | A | 10/2001 | |
| JP | 2002-234988 | A | 8/2002 | |
| JP | 2009-147014 | A | 7/2009 | |
| JP | 2014-148586 | A | 8/2014 | |
| JP | 2014-521754 | A | 8/2014 | |
| WO | WO 2010/1286011 | A1 | 11/2010 | |
| WO | WO 2015/001667 | A1 | 1/2015 | |

OTHER PUBLICATIONS

No. 655 Labo Plastomill web page, CG Engineering Ltd., Part., at http://www.cg-toyoseiki.com/www/2a-p655.htm, last visited Dec. 23, 2017, all pages.*
Opinion, European Patent Office, Jun. 27, 2018, all pages.*
Machine translation, Kitada, Japanese Pat. Pub. No. JP 2014-148586, translation date: Jul. 19, 2018, Espacenet, all pages.*
Machine translation, Togashi, Japanese Pat. Pub. No. JP H11-323097, translation date: Jul. 19, 2018, Espacenet, all pages.*
International Search Report for PCT/JP2016/051593 (PCT/ISA/210) dated Apr. 5, 2016.
Written Opinion of the international Searching Authority for PCT/JP2016/051593 (PCT/ISA/237) dated Apr. 5, 2016.

* cited by examiner

US 10,079,188 B2

RESIN COMPOSITION FOR ENCAPSULATING, MANUFACTURING METHOD OF ON-VEHICLE ELECTRONIC CONTROL UNIT, AND ON-VEHICLE ELECTRONIC CONTROL UNIT

TECHNICAL FIELD

The present invention relates to a resin composition for encapsulating, a manufacturing method of an on-vehicle electronic control unit, and an on-vehicle electronic control unit.

BACKGROUND ART

Recently, it is considered that a substrate on which an electronic component or the like is mounted is encapsulated with an encapsulating resin, as an on-vehicle electronic control unit. Examples of such a technology include a technology described in Patent Document 1.

Patent Document 1 is a technology which relates to a resin encapsulating type electronic control device, including a wiring substrate provided with a through hole, an electronic component mounted on the wiring substrate, a metal base on which the wiring substrate is mounted, and a connector which is attached to the metal base and electrically connects the wiring substrate to the external, in which a front surface of the wiring substrate and a part of the metal base are integrally encapsulated and molded by a thermosetting resin.

RELATED DOCUMENT

Patent Document

[Patent Document 1] Japanese Laid-open Patent Publication No. 2009-147014

SUMMARY OF THE INVENTION

As described above, it is considered that an on-vehicle electronic control unit is manufactured by encapsulating a wiring substrate on which an electronic component or the like is mounted with a resin composition for encapsulating. However, it is concerned that an unfilled portion such as a weld void is generated at the time of encapsulating the electronic component, and it is required to prevent the unfilled portion from being generated. In addition, it is important to improve adhesiveness of the encapsulating resin with respect to the wiring substrate. So far, it is difficult to realize a resin composition for encapsulating with an excellent balance between filling properties and the adhesiveness with respect to the wiring substrate.

According to the present invention, provided is a resin composition for encapsulating which is used for forming an encapsulating resin of an on-vehicle electronic control unit including a wiring substrate, a plurality of electronic components mounted over the wiring substrate, and the encapsulating resin encapsulating the electronic component, the resin composition including: a thermosetting resin; and imidazoles, in which when a torque value is measured over time under conditions of the number of rotations of 30 rpm and a measurement temperature of 175° C. by using Labo Plastomill, a time $T_1$ at which the torque value is less than or equal to 2 times a minimum torque value is longer than or equal to 15 seconds and shorter than or equal to 100 seconds, and the minimum torque value is greater than or equal to 0.5 N·m and less than or equal to 2.5 N·m.

In addition, according to the present invention, provided is a manufacturing method of an on-vehicle electronic control unit, including: a step of mounting a plurality of electronic components over at least one surface of a wiring substrate; and a step of encapsulating and molding the plurality of electronic components by using the resin composition for encapsulating described above.

In addition, according to the present invention, provided is an on-vehicle electronic control unit, including: a wiring substrate; a plurality of electronic components which are mounted over at least one surface of the wiring substrate; and an encapsulating resin which is formed by curing the resin composition for encapsulating described above and encapsulates the electronic component.

According to the present invention, in a resin composition for encapsulating which is used for forming an encapsulating resin configuring an on-vehicle electronic control unit, it is possible to improve a balance between filling properties and adhesiveness with respect to a wiring substrate.

BRIEF DESCRIPTION OF THE DRAWINGS

The object described above and other objects, characteristics and advantages will be more apparent by preferred embodiments described below, and the following drawings associated therewith.

DESCRIPTION OF EMBODIMENTS

Figure 1:
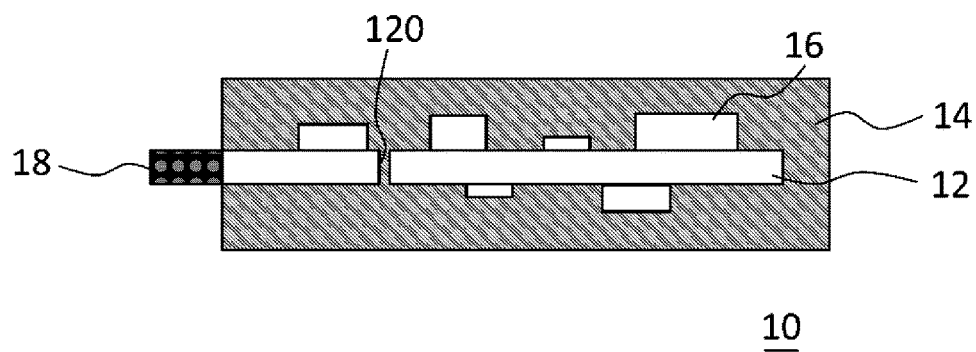
FIG. 1 is a schematic sectional view illustrating an example of an on-vehicle electronic control unit according to an embodiment.

Hereinafter, embodiments will be described by using the drawings. Furthermore, in all of the drawings, the same reference numerals are applied to the same constituents, and the description thereof will not be repeated.

FIG. 1 is a schematic sectional view illustrating an example of an on-vehicle electronic control unit 10 according to this embodiment.

A resin composition for encapsulating according to this embodiment is used for forming an encapsulating resin 14 of the on-vehicle electronic control unit 10 which includes a wiring substrate 12, a plurality of electronic components 16 mounted on the wiring substrate 12, and the encapsulating resin 14 encapsulating the electronic component 16.

The resin composition for encapsulating contains a thermosetting resin and imidazoles. In addition, in the resin composition for encapsulating, when a torque value is measured over time under conditions of the number of rotations of 30 rpm and a measurement temperature of 175° C. by using Labo Plastomill, a time $T_1$ at which the torque value is less than or equal to 2 times a minimum torque value is longer than or equal to 15 seconds and shorter than or equal to 100 seconds, and the minimum torque value is greater than or equal to 0.5 N·m and less than or equal to 2.5 N·m.

As described above, the on-vehicle electronic control unit, for examples, is formed by encapsulating and molding the electronic component by using the resin composition for encapsulating. However, in a step of molding the resin composition for encapsulating, there is a concern that an unfilled portion such as a weld void, due to a difference in flow properties according to the place, may be generated. In particular, in a case of using a wiring substrate having a large area on which a plurality of electronic components are mounted, as with the on-vehicle electronic control unit, it is concerned that such an unfilled portion is more remarkably generated. For this reason, filling properties of the resin composition for encapsulating are required to be improved. On the other hand, it is also important to improve adhesiveness between the encapsulating resin formed by using the resin composition for encapsulating and the wiring substrate. This is because delamination due to a decrease in adhesiveness between an insulating layer such as a solder resist, disposed on an uppermost layer of the wiring substrate, and the encapsulating resin is prevented from occurring. In particular, there is a case where the solder resist contains a component which can inhibit the adhesiveness with respect to the encapsulating resin such as a silicone compound, and thus, the adhesiveness is required to be further improved. However, in the previous technology, it is difficult to realize a resin composition for encapsulating having an excellent balance between the filling properties and the adhesiveness with respect to the wiring substrate.

As a result of intensive studies, the present inventors have newly found that it is possible to obtain a resin composition for encapsulating in which a balance between the filling properties and the adhesiveness with respect to the wiring substrate can be improved by containing a thermosetting resin and imidazoles, and by controlling a behavior of a torque change measured under specific conditions by using Labo Plastomill. The behavior of the torque change is the minimum torque value, and the time $T_1$ at which the torque value is less than or equal to 2 times the minimum torque value. The resin composition for encapsulating according to this embodiment is realized on the basis of such findings. Therefore, according to this embodiment, in the resin composition for encapsulating which is used for forming the encapsulating resin configuring the on-vehicle electronic control unit, it is possible to improve the balance between the filling properties and the adhesiveness with respect to the wiring substrate.

Hereinafter, an on-vehicle electronic control unit, a resin composition for encapsulating, and a manufacturing method of an on-vehicle electronic control unit according to this embodiment will be described in detail.

First, the on-vehicle electronic control unit 10 will be described.

The on-vehicle electronic control unit 10 is used for controlling an engine, various on-board equipments, or the like. As illustrated in FIG. 1, the on-vehicle electronic control unit 10, for example, includes the wiring substrate 12, the plurality of electronic components 16 mounted on at least one surface of the wiring substrate 12, and the encapsulating resin 14 encapsulating the electronic component 16. The wiring substrate 12 includes a connection terminal 18 for being connected to the external on at least one side. The connection terminal 18 is fitted into an opposing connector, and thus, the on-vehicle electronic control unit 10 according to an example of this embodiment is electrically connected to the opposing connector through the connection terminal 18.

The wiring substrate 12, for example, is a wiring substrate in which circuit wiring is disposed on one or both of one surface and the other surface on a side opposite to the one surface. As illustrated in FIG. 1, the wiring substrate 12, for example, is in the shape of a flat plate. In this embodiment, for example, an organic substrate formed of an organic material such as polyimide can be adopted as the wiring substrate 12. The wiring substrate 12, for example, may include a through hole 120 which penetrates the wiring substrate 12 and connects one surface to the other surface. In this case, wiring disposed on one surface of the wiring substrate 12 is electrically connected to wiring disposed on the other surface through a conductor pattern disposed in the through hole 120.

The wiring substrate 12, for example, includes a solder resist layer on one surface on which the electronic component 16 is mounted. The solder resist layer can be formed by using a resin composition for forming a solder resist which is usually used in a semiconductor device field. In this embodiment, for example, the solder resist layer can be disposed on one surface and the other surface of the wiring substrate 12.

The solder resist layer disposed on one surface of the wiring substrate 12 or both of the one surface and the other surface, for example, is formed of a resin composition containing a silicone compound. Accordingly, it is possible to realize a solder resist layer having excellent surface smoothness.

In manufacturing of the on-vehicle electronic control unit 10, there is a case where it is difficult to improve the adhesiveness of the encapsulating resin with respect to the wiring substrate in which the solder resist layer containing the silicone compound or the like is formed on the uppermost layer. In this embodiment, the resin composition for encapsulating is used in which the thermosetting resin and the imidazoles are contained, and the behavior of the torque change measured under specific conditions by using Labo Plastomill is controlled. For this reason, as described above, even in a case where the solder resist layer containing the silicone compound or the like is disposed on the uppermost layer of the wiring substrate 12, it is possible to improve a balance between the filling properties of the resin composition for encapsulating and the adhesiveness with respect to the wiring substrate 12 of the encapsulating resin 14.

As illustrated in FIG. 1, for example, the plurality of electronic components 16 are mounted on each of the one surface and the other surface of the wiring substrate 12. On the other hand, the electronic component 16 may be disposed on only one surface of the wiring substrate 12, but not on the other surface of the wiring substrate 12. The electronic component 16 is not particularly limited insofar as the electronic component can be mounted on the on-vehicle electronic control unit, and examples of the electronic component 16 include a microcomputer.

The encapsulating resin 14 is formed by molding and curing the resin composition for encapsulating to encapsulate the electronic component 16. In this embodiment, the encapsulating resin 14, for example, is formed to encapsulate the wiring substrate 12 along with the electronic component 16. In the example illustrated in FIG. 1, the encapsulating resin 14 is disposed to encapsulate the one surface and the other surface of the wiring substrate 12, and the electronic component 16 mounted on the wiring substrate 12. In addition, the encapsulating resin 14, for example, is formed to encapsulate a part or all of the wiring substrate 12. In FIG. 1, a case is exemplified in which the encapsulating resin 14 is disposed such that the connection terminal 18 is exposed and all the other portions are encapsulated without encapsulating the connection terminal 18 of the wiring substrate 12.

In the on-vehicle electronic control unit 10 according to this embodiment, the wiring substrate 12, for example, may be mounted on a metal base. The metal base, for example, can function as a heatsink for releasing heat which is generated from the electronic component 16. In this embodiment, for example, the metal base and the wiring substrate 12 mounted on the metal base are integrally encapsulated and molded by the resin composition for encapsulating, and thus, the on-vehicle electronic control unit 10 can be formed. A metal material configuring the metal base is not particularly limited, and examples of the metal material can include iron, copper, and aluminum, an alloy containing one type or two or more types thereof, and the like. Furthermore, the on-vehicle electronic control unit 10 may not include the metal base.

Next, the resin composition for encapsulating will be described.

In the resin composition for encapsulating, a glass transition temperature Tg of a cured material which can be obtained by being heated at 175° C. for 4 hours is preferably higher than or equal to 130° C., is more preferably higher than or equal to 140° C., and is even more preferably higher than or equal to 150° C. Accordingly, it is possible to contribute to further improvement in a balance between the filling properties of the resin composition for encapsulating and the adhesiveness of the encapsulating resin 14 with respect to the wiring substrate 12. In addition, it is possible to improve temperature cycle resistance of the on-vehicle electronic control unit 10. In this embodiment, it is particularly preferable that the glass transition temperature Tg is higher than or equal to 153° C. from the viewpoint of improving a balance between the filling properties or the adhesiveness and the temperature cycle resistance.

In the resin composition for encapsulating, an upper limit of the glass transition temperature Tg of the cured material which can be obtained by being heated at 175° C. for 4 hours is not particularly limited, and for example, the upper limit is lower than or equal to 300° C., is preferably lower than or equal to 250° C., and is more preferably lower than or equal to 200° C.

In this embodiment, the glass transition temperature Tg, for example, can be calculated from a measurement result obtained by postcuring a sample piece, which is obtained by performing injection molding with respect to the resin composition for encapsulating at a mold temperature of 175° C. and an injection pressure of 6.9 MPa for a curing time of 120 seconds by using a low pressure transfer molding machine, at 175° C. for 4 hours, and then, by measuring the sample piece under conditions of a measurement temperature range of 0° C. to 320° C. and a temperature rising rate of 5° C./minute by using a thermomechanical analysis device. For example, KTS-15 (manufactured by Kohtaki Precision Machine Co., Ltd.) can be used as the low pressure transfer molding machine. In addition, for example, TMA100 (manufactured by Seiko Instruments Inc.) or TMA7100 (manufactured by Hitachi High-Tech Science Corporation) can be used as the thermomechanical analysis device.

Figure 2:
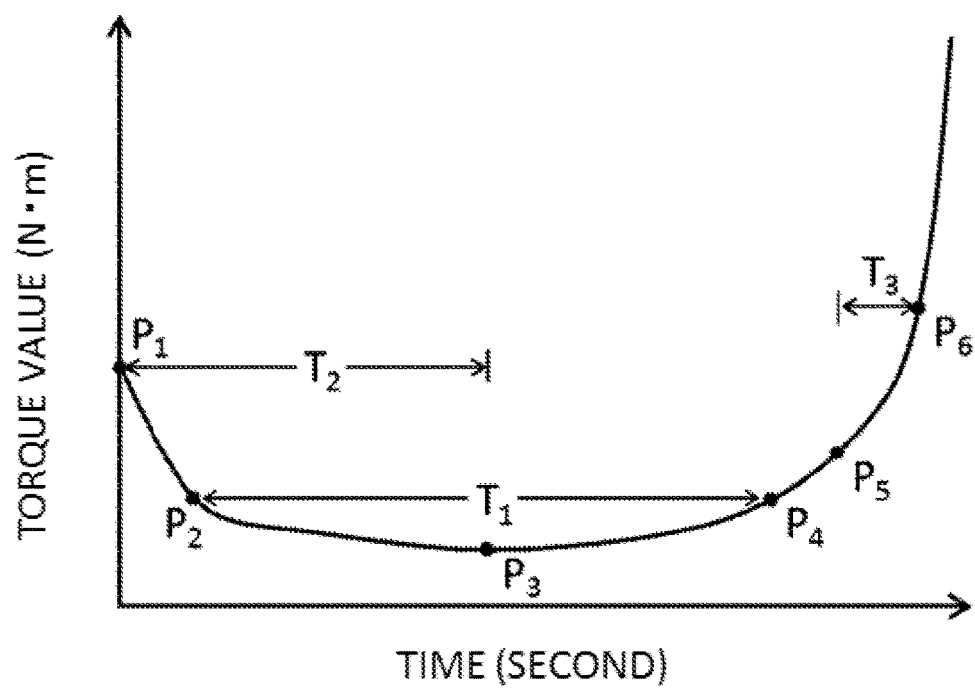
FIG. 2 is a graph schematically illustrating a relationship between a torque value obtained from measurement using Labo Plastomill and a measurement time.

FIG. 2 is a graph schematically illustrating a relationship between a torque value obtained from measurement using Labo Plastomill and a measurement time. As illustrated in FIG. 2, in this embodiment, a start point of Labo Plastomill measurement is set to $P_1$, a point at which the torque value becomes a minimum value (the minimum torque value) is set to $P_3$, a point at which the torque value becomes 2 times the minimum torque value during a period from $P_1$ to $P_3$ is set to $P_2$, a point at which the torque value becomes 2 times the minimum torque value after $P_3$ is set to $P_4$, a point at which the torque value becomes 3 N·m after $P_3$ is set to $P_5$, and a point at which the torque value becomes 6 N·m after $P_3$ is set to $P_6$. In addition, the start point of the Labo Plastomill measurement is a point at which a material is put into Labo Plastomill, and a torque rapidly increases, and then, the torque starts to decrease.

In the resin composition for encapsulating, when the torque value is measured over time under conditions of the number of rotations of 30 rpm and a measurement temperature of 175° C. by using Labo Plastomill, the time $T_1$ at which the torque value is less than or equal to 2 times the minimum torque value is longer than or equal to 15 seconds and shorter than or equal to 100 seconds. In the graph illustrated in FIG. 2, a time from $P_2$ to $P_4$ corresponds to $T_1$. Accordingly, as described above, it is possible to contribute to improvement in a balance between the filling properties of the resin composition for encapsulating and the adhesiveness of the encapsulating resin 14 with respect to the wiring substrate 12. In this embodiment, it is more preferable that the time $T_1$ is longer than or equal to 20 seconds and shorter than or equal to 90 seconds from the viewpoint of improving the filling properties of the resin composition for encapsulating.

In addition, in the resin composition for encapsulating, when the torque value is measured over time under conditions of the number of rotations of 30 rpm and a measurement temperature of 175° C. by using Labo Plastomill, the minimum torque value is greater than or equal to 0.5 N·m and less than or equal to 2.5 N·m. In the graph illustrated in FIG. 2, the torque value at $P_3$ corresponds to the minimum torque value. Accordingly, as described above, it is possible to contribute to improvement in a balance between the filling properties of the resin composition for encapsulating and the adhesiveness of the encapsulating resin 14 with respect to the wiring substrate 12. In this embodiment, the minimum torque value is more preferably greater than or equal to 0.5 N·m and less than or equal to 2.0 N·m, is even more preferably greater than or equal to 0.6 N·m and less than or equal to 2.0 N·m, and is particularly preferably greater than or equal to 0.6 N·m and less than or equal to 1.2 N·m, from the viewpoint of more effectively improving a balance between the filling properties and the adhesiveness.

In this embodiment, by simultaneously controlling the time $T_1$ of the resin composition for encapsulating and the minimum torque value, it is possible to improve a balance between the filling properties of the resin composition for encapsulating and the adhesiveness of the encapsulating resin 14 with respect to the wiring substrate 12. The reason is not obvious, but it is estimated that this is because an unfilled portion such as a weld void can be prevented from being generated by enabling flow properties of the resin composition for encapsulating to be controlled such that a difference in fluidity according to the place does not occur while obtaining sufficient fluidity for molding, and a decrease in the adhesiveness due to a temperature change at the time of forming the encapsulating resin 14 can be suppressed.

In the resin composition for encapsulating, for example, when the torque value is measured over time under conditions of the number of rotations of 30 rpm and a measurement temperature of 175° C. by using Labo Plastomill, a time $T_2$ from start of measurement until reaching the minimum torque value is longer than or equal to 5 seconds and shorter than or equal to 40 seconds. In the graph illustrated in FIG. 2, a time it is possible to period from $P_1$ to $P_3$ corresponds to $T_2$. Accordingly, it is possible to more effectively improve the filling properties of the resin composition for encapsulating. In this embodiment, it is more preferable that the time $T_2$ is longer than or equal to 10 seconds and shorter than or equal to 35 seconds from the viewpoint of improving the filling properties.

In addition, in the resin composition for encapsulating, for example, when the torque value is measured over time under conditions of the number of rotations 30 rpm and a measurement temperature of 175° C. by using Labo Plastomill, a time $T_3$ from a point at which the torque value becomes 3 N·m after the minimum torque value to a point at which the torque value becomes 6 N·m is longer than or equal to 2 seconds and shorter than or equal to 20 seconds. In the graph illustrated in FIG. 2, a time from $P_5$ to $P_6$ corresponds to $T_3$. Accordingly, it is possible to further improve the filling properties of the resin composition for encapsulating or a manufacturing efficiency of the on-vehicle electronic control unit 10. In particular, it is more preferable that the time $T_3$ is longer than or equal to 3 seconds from the viewpoint of further improving the filling properties by relaxing an internal stress at the time of performing molding. In addition, it is more preferable that the time $T_3$ is shorter than or equal to 10 seconds from the viewpoint of further improving the manufacturing efficiency.

In this embodiment, it is possible to set all of the glass transition temperature Tg, the time $T_1$, the time $T_2$, the time $T_3$, and the minimum torque value of the resin composition for encapsulating to be in a desired range, for example, by controlling a preparation method of the resin composition for encapsulating, by suitably selecting each of types or formulation ratios of components configuring the resin composition for encapsulating, and the like. For example, the present inventors have estimated that it is important to mix the respective components, and then, to perform fine pulverizing with respect to the obtained mixture by a rotation ball mill under certain conditions, as the preparation method of the resin composition for encapsulating. For example, it is considered that performing the fine pulverizing using the rotation ball mill by adjusting conditions such as a volume filling rate of a ball with respect to a device volume and a material feed rate (kg/hr) affects the glass transition temperature Tg, the time $T_1$, the time $T_2$, the time $T_3$, and the minimum torque value of the resin composition for encapsulating. In addition, it is considered that controlling conditions of a melting and kneading step after the fine pulverizing using the rotation ball mill, continuously performing a process from mixing the respective components to melting and kneading, or the like affects properties of the resin composition for encapsulating. Furthermore, the preparation method of the resin composition for encapsulating is not limited thereto.

In this embodiment, for example, it is possible to set a molding shrinkage factor of the resin composition for encapsulating which is measured on the basis of JIS K 6911 to be less than or equal to 0.4%. Accordingly, it is possible to more effectively improve the adhesiveness of the encapsulating resin 14 with respect to the electronic component 16. It is more preferable that the molding shrinkage factor of the resin composition for encapsulating is less than or equal to 0.3%. On the other hand, a lower limit value of the molding shrinkage factor of the resin composition for encapsulating is not particularly limited, and for example, the lower limit value can be 0%, and is more preferably 0.1% from the viewpoint of improving releasing properties. Furthermore, in this embodiment, measurement of the molding shrinkage factor, for example, can be performed with respect to a sample piece which is prepared under conditions of a mold temperature of 175° C., an injection pressure of 6.9 MPa, and a curing time of 120 seconds by using a low pressure transfer molding machine, on the basis of JIS K 6911. In addition, for example, KTS-15 (manufactured by Kohtaki Precision Machine Co., Ltd.) can be used as the low pressure transfer molding machine.

In addition, in this embodiment, for example, a gel time of the resin composition for encapsulating can be longer than or equal to 10 seconds and shorter than or equal to 60 seconds. Accordingly, it is possible to improve a balance between the filling properties of the resin composition for encapsulating and the molding properties. The gel time of the resin composition for encapsulating is more preferably longer than or equal to 15 seconds and shorter than or equal to 50 seconds, and is particularly preferably longer than or equal to 18 seconds and shorter than or equal to 45 seconds.

In addition, in this embodiment, for example, a flow length of the resin composition for encapsulating which is measured by a spiral flow can be greater than or equal to 40 cm and less than or equal to 150 cm. Accordingly, it is possible to more effectively improve the filling properties with respect to a narrow path such as a through hole, which penetrates a substrate. It is more preferable that a spiral flow length of the resin composition for encapsulating is greater than or equal to 45 cm and less than or equal to 125 cm. Furthermore, measurement of the spiral flow, for example, can be performed by injecting the resin composition for encapsulating into a mold for measuring a spiral flow based on EMMI-1-66 under conditions of a mold temperature of 175° C., an injection pressure of 6.9 MPa, and a curing time of 120 seconds by using a low pressure transfer molding machine ("KTS-15", manufactured by Kohtaki Precision Machine Co., Ltd.), and by measuring the flow length.

It is possible to set each of the molding shrinkage factor, the gel time, and the spiral flow length of the resin composition for encapsulating to be in a desired range, for example, by controlling the preparation method of the resin composition for encapsulating, by suitably selecting each of the types or the formulation ratios of the components configuring the resin composition for encapsulating, and the like.

As described above, the resin composition for encapsulating according to this embodiment contains the thermosetting resin and the imidazoles. Accordingly, in the resin composition for encapsulating, it is possible to improve a balance between the filling properties and the adhesiveness with respect to the wiring substrate. In particular, by containing the imidazoles, it is possible to more effectively improve a balance between the adhesiveness with respect to the wiring substrate 12 and the temperature cycle resistance. For this reason, it is possible to contribute to improvement in reliability of the on-vehicle electronic control unit 10.

Hereinafter, each of the components configuring the resin composition for encapsulating will be described in detail.

((A) Thermosetting Resin)

Examples of a thermosetting resin (A) include one type or two or more types selected from the group consisting of an epoxy resin, a phenolic resin, an oxetane resin, a (meth) acrylate resin, an unsaturated polyester resin, a diallyl phthalate resin, and a maleimide resin. Among them, it is particularly preferable that the thermosetting resin (A) includes the epoxy resin from the viewpoint of improving curing properties, storage properties, heat resistance, moisture resistance, and chemical resistance.

A monomer, an oligomer, and an overall polymer, which have two or more epoxy groups in one molecule, can be used as the epoxy resin included in the thermosetting resin (A), and a molecular weight or a molecular structure thereof is not particularly limited. In this embodiment, examples of the epoxy resin include one type or two or more types selected from the group consisting of a biphenyl type epoxy resin; a bisphenol type epoxy resin such as a bisphenol A type epoxy resin, a bisphenol F type epoxy resin, and a tetramethyl bisphenol F type epoxy resin; a stilbene type epoxy resin; a novolac type epoxy resin such as a phenol novolac type epoxy resin and a cresol novolac type epoxy resin; a polyfunctional epoxy resin such as a trisphenol type epoxy resin which is exemplified as a triphenol methane type epoxy resin, an alkyl modified triphenol methane type epoxy resin, and the like; a phenol aralkyl type epoxy resin such as a phenol aralkyl type epoxy resin having a phenylene skeleton, a naphthol aralkyl type epoxy resin having a phenylene skeleton, a phenol aralkyl type epoxy resin having a biphenylene skeleton, and a naphthol aralkyl type epoxy resin having a biphenylene skeleton; a naphthol type epoxy resin such as a dihydroxy naphthalene type epoxy resin and an epoxy resin which is obtained by glycidyl etherizing a dimer of dihydroxy naphthalene; a triazine nucleus-containing epoxy resin such as triglycidyl isocyanurate and monoallyl diglycidyl isocyanurate; and a bridged cyclic hydrocarbon compound modified phenol type epoxy resin such as dicyclopentadiene modified phenol type epoxy resin. Among them, it is more preferable that the epoxy resin includes one type or two or more types selected from a novolac type epoxy resin, a biphenyl type epoxy resin, and a phenol aralkyl type epoxy resin, from the viewpoint of improving a balance in various properties such as the adhesiveness, the filling properties, the heat resistance, and the moisture resistance.

The content of the thermosetting resin (A) in the resin composition for encapsulating is preferably greater than or equal to 2 mass %, is more preferably greater than or equal to 3 mass %, and is particularly preferably greater than or equal to 4 mass %, with respect to the total resin composition for encapsulating. By setting the content of the thermosetting resin (A) to be greater than or equal to the lower limit value described above, it is possible to improve the fluidity at the time of performing molding. For this reason, it is possible to improve the filling properties or molding stability. On the other hand, the content of the thermosetting resin (A) in the resin composition for encapsulating is preferably less than or equal to 50 mass %, is more preferably less than or equal to 30 mass %, and is particularly preferably less than or equal to 15 mass %, with respect to the total resin composition for encapsulating. By setting the content of the thermosetting resin (A) to be less than or equal to the upper limit value described above, it is possible to improve moisture resistance reliability or reflow resistance in the on-vehicle electronic control unit 10.

((B) Curing Agent)

The resin composition for encapsulating, for example, can contain a curing agent (B). The curing agent (B) contained in the resin composition for encapsulating, for example, can be classified roughly into three types such as a polyaddition type curing agent, a catalyst type curing agent, and a condensation type curing agent.

Examples of the polyaddition type curing agent used as the curing agent (B) include one type or two or more types selected from the group consisting of a polyamine compound including dicyan diamide (DICY), organic acid dihydrazide, and the like, in addition to aliphatic polyamine such as diethylene triamine (DETA), triethylene tetramine (TETA), and metaxylene diamine (MXDA), aromatic polyamine such as diaminodiphenyl methane (DDM), m-phenylene diamine (MPDA), and diaminodiphenyl sulfone (DDS); an acid anhydride including an alicyclic acid anhydride such as a hexahydrophthalic anhydride (HHPA) and a methyl tetrahydrophthalic anhydride (MTHPA), an aromatic acid anhydride such as a trimellitic anhydride (TMA), a pyromellitic anhydride (PMDA), and a benzophenone tetracarboxylic acid (BTDA), and the like; a phenolic resin-based curing agent such as a novolac type phenolic resin, polyvinyl phenol, and an aralkyl type phenolic resin; a polymercaptan compound such as polysulfide, thioester, and thioether; an isocyanate compound such as an isocyanate prepolymer and blocked isocyanate; and organic acids such as carboxylic acid-containing polyester resin.

Examples of the catalyst type curing agent used as the curing agent (B) include one type or two or more types selected from the group consisting of a tertiary amine compound such as benzyl dimethyl amine (BDMA) and 2,4,6-trisdimethyl aminomethyl phenol (DMP-30); and a Lewis acid such as a BF3 complex.

Examples of the condensation type curing agent used as the curing agent (B) include one type or two or more types selected from the group consisting of a resole type phenolic resin; a urea resin such as a methylol group-containing urea resin; and a melamine resin such as a methylol group-containing melamine resin.

Among them, it is more preferable that the curing agent (B) includes the phenolic resin-based curing agent, from the viewpoint of improving a balance in flame resistance, the moisture resistance, electrical properties, the curing properties, storage stability, and the like. A monomer, an oligomer, and an overall polymer, which have two or more phenolic hydroxyl groups in one molecule, can be used as the phenolic resin-based curing agent, and a molecular weight and a molecular structure thereof are not particularly limited. Examples of the phenolic resin-based curing agent used as the curing agent (B) include one type or two or more types selected from the group consisting of a novolac type phenolic resin such as a phenol novolac resin, a cresol novolac resin, and bisphenol novolac resin; polyvinyl phenol; a polyfunctional type phenolic resin such as a triphenol methane type phenolic resin; a modified phenolic resin such as a terpene modified phenolic resin and a dicyclopentadiene modified phenolic resin; a phenol aralkyl type phenolic resin such as a phenol aralkyl resin having a phenylene skeleton and/or a biphenylene skeleton and a naphthol aralkyl resin having a phenylene skeleton and/or a biphenylene skeleton; and a bisphenol compound such as bisphenol A and bisphenol F. Among them, it is more preferable that the phenolic resin-based curing agent includes at least one of the novolac type phenolic resin and the phenol aralkyl type phenolic resin, from the viewpoint of improving the curing properties of the resin composition for encapsulating.

The content of the curing agent (B) in the resin composition for encapsulating is preferably greater than or equal to 1 mass %, is more preferably greater than or equal to 2 mass %, and is particularly preferably greater than or equal to 3 mass %, with respect to the total resin composition for encapsulating. By setting the content of the curing agent (B) to be greater than or equal to the lower limit value described above, it is possible to realize excellent fluidity at the time of performing molding, and to improve the filling properties or the molding properties. On the other hand, the content of the curing agent (B) in the resin composition for encapsulating is preferably less than or equal to 40 mass %, is more preferably less than or equal to 25 mass %, and is particularly preferably less than or equal to 10 mass %, with respect to the total resin composition for encapsulating. By setting the content of the curing agent (B) to be less than or equal to the upper limit value described above, it is possible to improve the moisture resistance reliability or the reflow resistance of the on-vehicle electronic control unit 10.

((C) Curing Catalyst)

The resin composition for encapsulating contains a curing catalyst (C). A curing catalyst which accelerates a cross-linking reaction between the thermosetting resin (A) (for example, an epoxy group of an epoxy resin) and the curing agent (B) (for example, a phenolic hydroxyl group of a phenolic resin-based curing agent) can be used as the curing catalyst (C).

The resin composition for encapsulating according to this embodiment contains imidazoles as the curing catalyst (C). Examples of the imidazoles can include one type or two or more types selected from an imidazole compound such as imidazole, 2-methyl imidazole, 2-undecyl imidazole, 2-heptadecyl imidazole, 1,2-dimethyl imidazole, 2-ethyl-4-methyl imidazole, 2-phenyl imidazole, 2-phenyl-4-methyl imidazole, 1-benzyl-2-phenyl imidazole, 1-benzyl-2-methyl imidazole, 1-cyanoethyl-2-methyl imidazole, 1-cyanoethyl-2-ethyl-4-methyl imidazole, 1-cyanoethyl-2-undecyl imidazole, 1-cyanoethyl-2-phenyl imidazole, 2-phenyl-4,5-dihydroxy dimethyl imidazole, and 2-phenyl-4-methyl-5-hydroxy methyl imidazole; an isocyanuric acid adduct of 1-cyanoethyl-2-undecyl imidazolium trimellitate, 1-cyanoethyl-2-phenyl imidazolium trimellitate, 2,4-diamino-6-[2'-methyl imidazolyl (1')]-ethyl-s-triazine, 2,4-diamino-6-[2'-undecyl imidazolyl (1')]-ethyl-s-triazine, 2,4-diamino-6-[2'-ethyl-4-methyl imidazolyl (1')]-ethyl-s-triazine, and 2,4-diamino-6-[2'-methyl imidazolyl (1')]-ethyl-s-triazine, an isocyanuric acid adduct of 2-phenyl imidazole, and an isocyanuric acid adduct of 2-methyl imidazole. In this embodiment, a case where the curing catalyst (C) includes one or both of 2-methyl imidazole and 2-phenyl imidazole as the imidazoles can be adopted as an example of a preferred aspect.

The content of the imidazoles is preferably greater than or equal to 0.01 mass %, is more preferably greater than or equal to 0.03 mass %, and is particularly preferably greater than or equal to 0.05 mass %, with respect to the total resin composition for encapsulating. By setting the content of the imidazoles to be greater than or equal to the lower limit value described above, it is possible to more effectively improve the adhesiveness of the encapsulating resin 14 with respect to the wiring substrate 12 or the temperature cycle resistance of the on-vehicle electronic control unit 10. In addition, it is possible to improve the curing properties at the time of performing encapsulating and molding. On the other hand, the content of the imidazoles is preferably less than or equal to 2.0 mass %, is more preferably less than or equal to 1.0 mass %, and is particularly preferably less than or equal to 0.5 mass %, with respect to the total resin composition for encapsulating. By setting the content of the imidazoles to be less than or equal to the upper limit value described above, it is possible to improve the fluidity at the time of performing encapsulating and molding, and to contribute to improvement in the filling properties.

Examples of the curing catalyst (C) can further include one type or two or more types selected from a phosphorus atom-containing compound such as organic phosphine, a tetrasubstituted phosphonium compound, a phosphobetaine compound, an adduct of a phosphine compound and a quinone compound, and an adduct of a phosphonium compound and a silane compound; and an amine-based curing accelerator other than the imidazoles, such as 1,8-diazabicyclo(5.4.0) undecene, in addition to the imidazoles. In this embodiment, a case where the curing catalyst (C) includes both of the imidazoles and the phosphorus atom-containing compound can be adopted as an example of a preferred aspect.

Examples of the organic phosphine which can be used in the resin composition for encapsulating include primary phosphine such as ethyl phosphine and phenyl phosphine; secondary phosphine such as dimethyl phosphine and diphenyl phosphine; and tertiary phosphine such as trimethyl phosphine, triethyl phosphine, tributyl phosphine, and triphenyl phosphine.

Examples of the tetrasubstituted phosphonium compound which can be used in the resin composition for encapsulating include a compound represented by General Formula (4) described below, and the like.

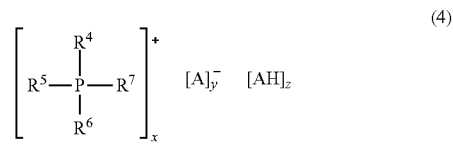

(In General Formula (4) described above, P represents a phosphorus atom. $R^4$, $R^5$, $R^6$, and $R^7$ represent an aromatic group or an alkyl group. A represents an anion of an aromatic organic acid having at least one functional group selected from a hydroxyl group, a carboxyl group, and a thiol group in an aromatic ring. AH represents an aromatic organic acid having at least one functional group selected from a hydroxyl group, a carboxyl group, and a thiol group in an aromatic ring. x and y are 1 to 3, z is 0 to 3, and x=y.)

The compound represented by General Formula (4), for example, can be obtained as described below, but an obtaining method is not limited thereto. First, tetrasubstituted phosphonium halide, an aromatic organic acid, and a base are organic solvent are evenly mixed, and aromatic organic acid anions are generated in this solution system. Next, it is possible to precipitate the compound represented by General Formula (4) in a case of adding water. In the compound represented by General Formula (4), it is preferable that $R^4$, $R^5$, $R^6$, and $R^7$, which are bonded to a phosphorus atom, are phenyl groups, AH is a compound having a hydroxyl group in an aromatic ring, that is phenols, and A is an anion of the phenols. Monocyclic phenols such as phenol, cresol, resorcin, and catechol, condensation polycyclic phenols such as naphthol, dihydroxy naphthalene, and anthraquinol, bisphenols such as bisphenol A, bisphenol F, and bisphenol S, polycyclic phenols such as phenyl phenol and biphenol, and the like are exemplified as the phenols described above.

Examples of the phosphobetaine compound which can be used in the resin composition for encapsulating include a compound represented by General Formula (5) described below, and the like.

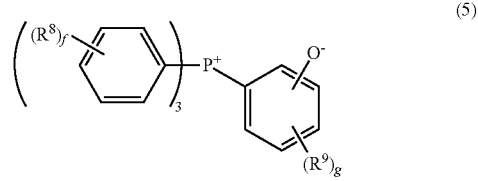

(In General Formula (5) described above, $R^8$ represents an alkyl group having 1 to 3 carbon atoms, and $R^9$ represents a hydroxyl group. f is 0 to 5, and g is 0 to 3.)

The compound represented by General Formula (5), for example, can be obtained as described below. First, the compound represented by General Formula (5) can be obtained through a step of bringing triaromatic substituted phosphine, which is tertiary phosphine, into contact with a diazonium salt, and of substituting the triaromatic substituted phosphine with a diazonium group of the diazonium salt. However, an obtaining method is not limited thereto.

Examples of the adduct of the phosphine compound and the quinone compound, which can be used in the resin composition for encapsulating, include a compound represented by General Formula (6) described below, and the like.

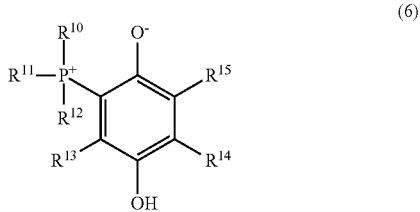

(6)

(In General Formula (6) described above, P represents a phosphorus atom. $R^{10}$, $R^{11}$, and $R^{12}$ represent an alkyl group having 1 to 12 carbon atoms or an aryl group having 6 to 12 carbon atoms, and may be identical to each other or different from each other. $R^{13}$, $R^{14}$, and $R^{15}$ represent a hydrogen atom or a hydrocarbon group having 1 to 12 carbon atoms, and may be identical to each other or different from each other, and $R^{14}$ is bonded to $R^{15}$, and thus, a cyclic structure may be formed.)

For example, a phosphine compound such as triphenyl phosphine, tris(alkyl phenyl) phosphine, tris(alkoxy phenyl) phosphine, trinaphthyl phosphine, and tris(benzyl) phosphine, which is not substituted or has a substituent such as an alkyl group and an alkoxyl group in an aromatic ring is preferable as the phosphine compound used in the adduct of the phosphine compound and the quinone compound, and examples of the substituent such as an alkyl group and an alkoxyl group include an alkyl group having 1 to 6 carbon atoms and an alkoxyl group having 1 to 6 carbon atoms. The triphenyl phosphine is preferable from the viewpoint of ready availability.

In addition, examples of the quinone compound used in the adduct of the phosphine compound and the quinone compound include benzoquinone and anthraquinones, and among them, p-benzoquinone is preferable from the viewpoint of the storage stability.

The adduct can be obtained by bringing tertiary organic phosphine and benzoquinones into contact with a solvent where both of the tertiary organic phosphine and the benzoquinones can be dissolved and by mixing them, as a manufacturing method of the adduct of the phosphine compound and the quinone compound. Examples of the solvent include ketones such as acetone or methyl ethyl ketone, and may be a solvent having low solubility with respect to the adduct. However, the solvent is not limited thereto.

In the compound represented by General Formula (6), a compound in which $R^{10}$, $R^{11}$, and $R^{12}$, which are bonded to a phosphorus atom, are phenyl groups, and $R^{13}$, $R^{14}$, and $R^{15}$ are hydrogen atoms, that is, a compound to which 1,4-benzoquinone and triphenyl phosphine are added is preferable from the viewpoint of decreasing a thermoelastic modulus of a cured material of the resin composition for encapsulating.

Examples of the adduct of the phosphonium compound and the silane compound, which can be used in the resin composition for encapsulating, include a compound represented by General Formula (7) described below, and the like.

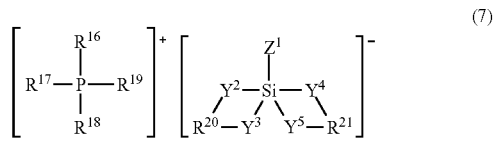

(7)

(In General Formula (7) described above, P represents a phosphorus atom, and Si represents a silicon atom. $R^{16}$, $R^{17}$, $R^{18}$, and $R^{19}$ each represent an organic group having an aromatic ring or a heterocyclic ring, or an aliphatic group, and may be identical to each other or different from each other. In the formula, $R^{20}$ is an organic group bonding a group $Y^2$ to a group $Y^3$. In the formula, $R^{21}$ is an organic group bonding a group $Y^4$ to a group $Y^5$. $Y^2$ and $Y^3$ represent groups formed of a proton released from a proton donating group, and the group $Y^2$ and the group $Y^3$ in the same molecule are bonded to a silicon atom, and thus, form a chelate structure. $Y^4$ and $Y^5$ represent groups formed of a proton released from a proton donating group, and the group $Y^4$ and the group $Y^5$ in the same molecule are bonded to a silicon atom, and thus, form a chelate structure. $R^{20}$ and $R^{21}$ may be identical to each other or different from each other, and $Y^2$, $Y^3$, $Y^4$, and $Y^5$ may be identical to each other or different from each other. $Z^1$ is an organic group having an aromatic ring or a heterocyclic ring, or an aliphatic group.)

In General Formula (7), examples of $R^{16}$, $R^{17}$, $R^{18}$, and $R^{19}$ include a phenyl group, a methyl phenyl group, a methoxy phenyl group, a hydroxy phenyl group, a naphthyl group, a hydroxy naphthyl group, a benzyl group, a methyl group, an ethyl group, an n-butyl group, an n-octyl group, a cyclohexyl group, and the like, and among them, an aromatic group having a substituent such as an alkyl group, an alkoxy group, and a hydroxyl group, such as a phenyl group, a methyl phenyl group, a methoxy phenyl group, a hydroxy phenyl group, and a hydroxy naphthyl group, or a non-substituted aromatic group is more preferable.

In addition, in General Formula (7), $R^{20}$ is an organic group which is bonded to $Y^2$ and $Y^3$. Similarly, $R^{21}$ is an organic group which is bonded to the group $Y^4$ and the group $Y^5$. $Y^2$ and $Y^3$ are groups formed of a proton released from a proton donating group, and the group $Y^2$ and the group $Y^3$ in the same molecule are bonded to a silicon atom, and thus, forma chelate structure. Similarly, $Y^4$ and $Y^5$ are groups formed of a proton released from a proton donating group, and the group $Y^4$ and the $Y^5$ in the same molecule are bonded to a silicon atom, and thus, form a chelate structure. A group $R^{20}$ and a group $R^{21}$ may be identical to each other or different from each other, and the group $Y^2$, the group $Y^3$, the group $Y^4$, and the group $Y^5$ may be identical to each other or different from each other. In General Formula (7), groups represented by —$Y^2$—$R^{20}$—$Y^3$— and —$Y^4$—$R^{21}$—$Y^5$— are configured of a group formed of two protons released from a proton donor, and an organic acid having at least two carboxyl groups or hydroxyl groups in the molecules is preferable, and further, an aromatic compound having at least two carboxyl groups or hydroxyl groups in the adjacent carbon configuring an aromatic ring is preferable, and an aromatic compound having at least two hydroxyl groups in the adjacent carbon configuring an aromatic ring is more preferable, as the proton donor.

Examples of the proton donor include catechol, pyrogallol, 1,2-dihydroxy naphthalene, 2,3-dihydroxy naphthalene, 2,2'-biphenol, 1,1'-bi-2-naphthol, a salicylic acid, a 1-hydroxy-2-naphthoic acid, a 3-hydroxy-2-naphthoic acid, a chloranilic acid, a tannic acid, 2-hydroxy benzyl alcohol, 1,2-cyclohexane diol, 1,2-propane diol, glycerin, and the like, and among them, catechol, 1,2-dihydroxy naphthalene, and 2,3-dihydroxy naphthalene are more preferable.

In addition, in General Formula (7), $Z^1$ represents an organic group having an aromatic ring or a heterocyclic ring or an aliphatic group, and specific examples thereof include an aliphatic hydrocarbon group such as a methyl group, an ethyl group, a propyl group, a butyl group, a hexyl group, and an octyl group, an aromatic hydrocarbon group such as a phenyl group, a benzyl group, a naphthyl group, and a biphenyl group, a glycidyloxy group such as a glycidyloxy propyl group, a mercaptopropyl group, and an aminopropyl group, a reactive substituent such as a mercapto group, an alkyl group having an amino group, and a vinyl group, or the like. Among them, the methyl group, the ethyl group, the phenyl group, the naphthyl group, and the biphenyl group are more preferable from the viewpoint of thermal stability.

A silane compound such as phenyl trimethoxy silane and a proton donor such as 2,3-dihydroxy naphthalene are added and dissolved in a flask into which methanol is put, and then, a sodium methoxide-methanol solution is dropped at a room temperature while being stirred, as a manufacturing method of the adduct of the phosphonium compound and the silane compound. Further, in a case where a solution in which tetrasubstituted phosphonium halide such as tetraphenyl phosphonium bromide, which is prepared in advance, is dissolved in methanol, is dropped thereinto at a room temperature while being stirred, crystals are precipitated. In a case where the precipitated crystals are subjected to filtration, water washing, and vacuum drying, the adduct of the phosphonium compound and the silane compound is obtained. However, the manufacturing method is not limited thereto.

The content of the curing catalyst (C) is preferably greater than or equal to 0.05 mass %, is more preferably greater than or equal to 0.08 mass %, and is particularly preferably greater than or equal to 0.10 mass %, with respect to the total resin composition for encapsulating. By setting the content of the curing catalyst (C) to be greater than or equal to the lower limit value described above, it is possible to effectively improve the curing properties at the time of performing encapsulating and molding. On the other hand, the content of the curing catalyst (C) is preferably less than or equal to 2.0 mass %, is more preferably less than or equal to 1.0 mass %, and is particularly preferably less than or equal to 0.5 mass %, with respect to the total resin composition for encapsulating. By setting the content of the curing catalyst (C) to be less than or equal to the upper limit value described above, it is possible to improve the fluidity at the time of performing encapsulating and molding, and to contribute to improvement in the filling properties.

((D) Inorganic Filler)

The resin composition for encapsulating, for example, can contain an inorganic filler (D). The inorganic filler (D), for example, can contain one type or two or more types selected from the group consisting of silica such as melting silica and crystal silica, alumina, aluminum hydroxide, magnesium hydroxide, silicon nitride, and aluminum nitride. Among them, it is more preferable to contain silica, and it is particularly preferable to contain melting silica, from the viewpoint of excellent general versatility. In addition, it is more preferable to contain aluminum hydroxide, from the viewpoint of improving flame retardance of an encapsulating resin formed by using the resin composition for encapsulating. In this embodiment, a case where both of the silica and the aluminum hydroxide are contained can be included as an example of a preferred aspect.

The inorganic filler (D), for example, can contain crushed silica. Accordingly, it is possible to reduce a manufacturing cost of the on-vehicle electronic control unit 10. In a case where the inorganic filler (D) contains the crushed silica, the content of the crushed silica, for example, can be greater than or equal to 10 mass % and less than or equal to 100 mass %, and is more preferably greater than or equal to 15 mass % and less than or equal to 95 mass %, with respect to the total inorganic filler (D). In addition, the inorganic filler (D) can contain spherical silica from the viewpoint of improving the fluidity of the resin composition for encapsulating and of contributing improvement in the molding stability or the filling properties. In a case where the inorganic filler (D) contains the spherical silica, the content of the spherical silica, for example, can be greater than or equal to 10 mass % and less than or equal to 100 mass %, and is more preferably greater than or equal to 15 mass % and less than or equal to 95 mass %, with respect to the total inorganic filler (D). In this embodiment, a case where both of the spherical silica and the crushed silica are contained as the inorganic filler (D) can be included as an example of a preferred aspect.

In a case where the inorganic filler (D) contains silica, the inorganic filler (D), for example, preferably contains silica having an average particle diameter $D_{50}$ of greater than or equal to 3 μm and less than or equal to 50 μm, and more preferably contains silica having an average particle diameter $D_{50}$ of greater than or equal to 10 μm and less than or equal to 30 μm. Accordingly, it is possible to more effectively improve a balance in the filling properties, the adhesiveness, the moisture resistance, the heat resistance, or the like. Furthermore, the average particle diameter $D_{50}$ of the silica, for example, can be measured by using a commercially available laser type particle diameter analyzer (for example, SALD-7000 manufactured by Shimadzu Corporation, or the like).

The content of the inorganic filler (D) in the resin composition for encapsulating is preferably greater than or equal to 60 mass %, and is more preferably greater than or equal to 70 mass %, with respect to the total resin composition for encapsulating. By setting the content of the inorganic filler (D) to be greater than or equal to the lower limit value described above, it is possible to attain low moisture absorbency and low thermal expandability, and to more effectively improve the moisture resistance reliability or the reflow resistance of the on-vehicle electronic control unit 10. On the other hand, the content of the inorganic filler (D) in the resin composition for encapsulating is preferably less than or equal to 90 mass %, and is more preferably less than or equal to 85 mass %, with respect to the total resin composition for encapsulating. By setting the content of the inorganic filler (D) to be less than or equal to the upper limit value described above, it is possible to more effectively improve the fluidity or the filling properties at the time of molding the resin composition for encapsulating.

((E) Silane Coupling Agent)

The resin composition for encapsulating, for example, can contain a silane coupling agent (E). Accordingly, it is possible to improve dispersibility of the inorganic filler (D), and to contribute to improvement in the moisture resistance reliability or the reflow resistance. In addition, it is also possible to improve the adhesiveness of the encapsulating resin 14 with respect to the wiring substrate 12. Examples of the silane coupling agent (E) can include one type or two or more types selected from epoxy silane, mercaptosilane, aminosilane, alkyl silane, ureido silane, vinyl silane, and methacryl silane.

Examples thereof include hydrolysates of vinyl trichlorosilane, vinyl trimethoxy silane, vinyl triethoxy silane, vinyl tris(β-methoxy ethoxy) silane, γ-methacryloxy propyl trimethoxy silane, β-(3,4-epoxy cyclohexyl) ethyl trimethoxy silane, γ-glycidoxy propyl trimethoxy silane, γ-glycidoxy propyl triethoxy silane, γ-glycidoxy propyl methyl dimethoxy silane, γ-methacryloxy propyl methyl diethoxy silane, γ-methacryloxy propyl triethoxy silane, vinyl triacetoxy silane, γ-mercaptopropyltrimethoxysilane, γ-aminopropyl triethoxy silane, γ-anilinopropyl trimethoxy silane, γ-anilinopropyl methyl dimethoxy silane, γ-[bis(β-hydroxy ethyl)]aminopropyl triethoxy silane, N-β-(aminoethyl)-γ-aminopropyl trimethoxy silane, N-β-(aminoethyl)-γ-aminopropyltriethoxy silane, N-β-(aminoethyl)-γ-aminopropyl methyl dimethoxy silane, N-phenyl-γ-aminopropyl trimethoxy silane, γ-(β-aminoethyl) aminopropyl dimethoxy methyl silane, N-(trimethoxy silyl propyl) ethylene diamine, N-(dimethoxy methyl silyl isopropyl) ethylene diamine, methyl trimethoxy silane, dimethyl dimethoxy silane, methyl triethoxy silane, N-β-(N-vinyl benzyl aminoethyl)-γ-aminopropyl trimethoxy silane, γ-chloropropyl trimethoxy silane, hexamethyl disilane, vinyl trimethoxy silane, γ-mercaptopropyl methyl dimethoxy silane, 3-isocyanate propyl triethoxy silane, 3-acryloxy propyl trimethoxy silane, and 3-triethoxy silyl-N-(1,3-dimethyl butylidene) propyl amine, and the like. One type thereof may be independently used, or two or more types thereof may be used in combination.

The content of the silane coupling agent (E) in the resin composition for encapsulating, for example, is preferably greater than or equal to 0.05 mass %, is more preferably greater than or equal to 0.1 mass %, and is particularly preferably greater than or equal to 0.15 mass %, with respect to the total resin composition for encapsulating. By setting the content of the silane coupling agent (E) to be greater than or equal to the lower limit value described above, it is possible to make the dispersibility of the inorganic filler (D) in the resin composition for encapsulating more excellent. For this reason, it is possible to more effectively improve the moisture resistance reliability, the reflow resistance, or the like. On the other hand, the content of the silane coupling agent (E) in the resin composition for encapsulating, for example, is preferably less than or equal to 2 mass %, is more preferably less than or equal to 1 mass %, and is particularly preferably less than or equal to 0.5 mass %. By setting the content of the silane coupling agent (E) to be less than or equal to the upper limit value described above, it is possible to make the fluidity of the resin composition for encapsulating excellent, and to improve the molding properties.

((F) Other Components)

In the resin composition for encapsulating, as necessary, for example, one or more types of various additives such as a coupling agent other than the silane coupling agent, a releasing property imparting agent, a coloring agent, an ion scavenger, oil, a low stress agent, a flame retarder, and an antioxidant can be suitably formulated. Examples of the coupling agent can include a known coupling agent such as a titanium-based compound, aluminum chelates, and an aluminum/zirconium-based compound. Examples of the releasing property imparting agent can include one type or two or more types selected from natural wax such as carnauba wax, synthetic wax such as montanoic acid ester wax or polyethylene oxide wax, a higher aliphatic acid such as zinc stearate and metal salts thereof, and paraffin. Examples of the coloring agent can include any one or both of carbon black and black titanium oxide. Examples of the ion scavenger can include hydrotalcite. Examples of the oil can include silicone oil. Examples of the low stress agent can include silicone rubber. Examples of the flame retarder can include one type or two or more types selected from magnesium hydroxide, zinc borate, zinc molybdate, and phosphazene. Examples of the antioxidant can include one type or two or more types selected from a phenol-based antioxidant, a phosphorous-based antioxidant, and a thio-ether-based antioxidant.

Next, the manufacturing method of the on-vehicle electronic control unit 10 will be described.

The manufacturing method of the on-vehicle electronic control unit 10 according to this embodiment, for example, is performed as described below. First, the plurality of electronic components 16 are mounted on at least one surface of the wiring substrate 12. Next, the plurality of electronic components 16 are encapsulated and molded by using the resin composition for encapsulating. The resin compositions exemplified as described above can be used as the resin composition for encapsulating.

Hereinafter, the manufacturing method of the on-vehicle electronic control unit 10 will be described in detail.

First, the plurality of electronic components 16 are mounted on at least one surface of the wiring substrate 12. In this embodiment, for example, the plurality of electronic components 16 can be mounted on each of one surface of the wiring substrate 12 and the other surface on a side opposite to the one surface. Accordingly, as illustrated in FIG. 1, it is possible to form the on-vehicle electronic control unit 10 in which the electronic component 16 is mounted on both surfaces of the wiring substrate 12. On the other hand, the electronic component 16 may be mounted on only one surface of the wiring substrate 12, and the electronic component 16 may not be mounted on the other surface. Furthermore, the wiring substrates and the electronic components exemplified as described above can be applied as the wiring substrate 12 and the electronic component 16.

Next, the plurality of electronic components 16 are encapsulated and molded by using the resin composition for encapsulating. Accordingly, it is possible to form the encapsulating resin 14 encapsulating the electronic component 16. In this embodiment, for example, the resin composition for encapsulating is molded to encapsulate the wiring substrate 12 along with the electronic component 16. The on-vehicle electronic control unit 10 exemplified in FIG. 1, for example, can be obtained by encapsulating and molding one surface and the other surface of the wiring substrate 12, and the electronic component 16 mounted on the wiring substrate 12 with the resin composition for encapsulating. In addition, in this embodiment, a part of all of the wiring substrate 12 is encapsulated with the resin composition for encapsulating, along with the plurality of electronic components 16. The on-vehicle electronic control unit 10 exemplified in FIG. 1, for example, can be obtained by molding the resin composition for encapsulating such that the connection terminal 18 is exposed and all the other portions are encapsulated without encapsulating the connection terminal 18 of the wiring substrate 12.

The manufacturing method of the on-vehicle electronic control unit 10 according to this embodiment, for example, can be performed as described above.

Furthermore, the present invention is not limited to the embodiment described above, and modifications, improvements, and the like in a range where the object of the present invention can be attained are included in the present invention.

EXAMPLES

Next, examples of the present invention will be described.
(Resin Composition for Encapsulating)
In each of Examples 1 to 7 and Comparative Examples 1 and 3, a resin composition for encapsulating was prepared as described below. First, each component was subjected to premixing by a Henschel mixer (a content of 200 liters and the number of rotations of 900 rpm), which was set to be in a room temperature state, for 20 minutes, according to a formulation shown in Table 1. Next, the obtained mixture was subjected to fine pulverizing by using a continuous rotation ball mill (Dynamic Mill MYD25, manufactured by NIPPON COKE & ENGINEERING CO., LTD., the number of rotations of a screw of 500 rpm, an alumina ball diameter of 10 mm, and a volume filling rate of a ball with respect to a device volume of 50%) while retaining a material temperature to be lower than or equal to 30° C. at a material feed rate of 200 kg/hr. Next, the mixture, which had been subjected to the fine pulverizing, was melted and kneaded by using a single screw kneader (a screw diameter D of 46 mm, an extruder length of 500 mm, a melting and kneading unit length of 7 D, the number of rotations of the screw of 200 rpm, and a discharge rate of 30 kg/hr). Next, the mixture after being kneaded was cooled and pulverized, and thus, a resin composition for encapsulating was obtained. Furthermore, each step from the premixing of the Henschel mixer until the resin composition for encapsulating was obtained was continuously performed.

In Comparative Example 2, a resin composition for encapsulating was prepared as described below. First, each component was subjected to premixing by using a Henschel mixer (a content of 200 liters and the number of rotations of 900 rpm) which was set to be in a room temperature state for 20 minutes, according to a formulation shown in Table 1. Next, the obtained mixture was melted and kneaded by using a single screw kneader (a screw diameter D of 46 mm, an extruder length of 500 mm, a melting and kneading unit length of 7 D, the number of rotations of the screw of 200 rpm, and a discharge rate of 30 kg/hr). Next, the mixture after being kneaded was cooled and pulverized, and thus, a resin composition for encapsulating was obtained. Furthermore, the details of each of the components in Table 1 are as described below. In addition, the unit in Table 1 is mass %.

(A) Thermosetting Resin
Thermosetting Resin 1: Orthocresol Novolac Type Epoxy Resin (EPICLON N-660, manufactured by DIC CORPORATION)
Thermosetting Resin 2: Phenol Aralkyl Type Epoxy Resin Having Biphenylene Skeleton (NC-3000, manufactured by Nippon Kayaku Co., Ltd.)
Thermosetting Resin 3: Biphenyl Type Epoxy Resin (YX-4000H, manufactured by Mitsubishi Chemical Corporation)
(B) Curing Agent
Curing Agent 1: Novolac Type Phenolic Resin (PR-HF-3, manufactured by Sumitomo Bakelite Co., Ltd.)
Curing Agent 2: Phenol Aralkyl Resin Having Phenylene Skeleton (XL-225-3L, manufactured by Mitsui Chemicals, Inc.)

Curing Agent 3: Aralkyl Type Phenolic Resin Having Biphenylene Skeleton (MEH-7851SS, manufactured by Meiwa Plastic Industries, Ltd.)
(C) Curing Catalyst
Curing Catalyst 1: 2-Methyl Imidazole (2MZ-H, manufactured by SHIKOKU CHEMICALS CORPORATION)
Curing Catalyst 2: Triphenyl Phosphine (PP360, manufactured by K•I Chemical Industry Co., LTD.)
Curing Catalyst 3: 2-Phenyl Imidazole (2PZ-PW, manufactured by SHIKOKU CHEMICALS CORPORATION, a fine powder)
(D) Inorganic Filler
Inorganic Filler 1: Spherical Silica (FB-950, manufactured by Denka Company Limited, an average particle diameter $D_{50}$ of 24 μm)
Inorganic Filler 2: Crushed Silica (RD-8, manufactured by TATSUMORI LTD., an average particle diameter $D_{50}$ of 15 μm)
Inorganic Filler 3: Aluminum Hydroxide
(E) Silane Coupling Agent
γ-Aminopropyl Triethoxy Silane (KBE-903, manufactured by Shin-Etsu Chemical Co., Ltd.)
(F) Other Components
Oil: Silicone Oil (FZ-3730, manufactured by Dow Corning Toray Co., Ltd.)
Low Stress Agent: Silicone Rubber (CF2152, manufactured by Dow Corning Toray Co., Ltd.)
Releasing Property Imparting Agent: Montanoic Acid Ester Wax (Licolub WE-4, manufactured by Clariant (Japan) K.K.)
Coloring Agent: Carbon Black (#5, manufactured by Mitsubishi Chemical Corporation)
(Measurement of Times $T_1$, $T_2$, and $T_3$)
In each of the examples and the comparative examples, times $T_1$, $T_2$, and $T_3$, and a minimum torque value were measured as described below, in the obtained resin composition for encapsulating. First, a melting torque of the resin composition for encapsulating was measured over time under conditions of the number of rotations of 30 rpm and a measurement temperature of 175° C. by using a Labo Plastomill tester (4C150, manufactured by Toyo Seiki Seisaku-sho, Ltd.). Next, the time $T_1$ at which a torque value was less than or equal to 2 times the minimum torque value, the time $T_2$ from start of measurement until reaching the minimum torque value, and the time $T_3$ from a point at which the torque value became 3 N·m after the minimum torque value to a point at which the torque value became 6 N·m were calculated on the basis of the measurement result. The start point of measurement was a point at which a material was put into a Labo Plastomill tester, and a torque rapidly increased, and then, the torque started to decrease. In addition, the minimum torque value was calculated from the measurement result. The results are shown in Table 1. In Table 1, the unit of the times $T_1$, $T_2$, and $T_3$ is second, and the unit of the minimum torque value is N·m.

(Molding Shrinkage Factor)
In each of the examples and the comparative examples, a molding shrinkage factor of the obtained resin composition for encapsulating was measured. The measurement was performed with respect to a sample piece prepared under conditions a mold temperature of 175° C., an injection pressure of 6.9 MPa, and a curing time of 120 seconds by using a low pressure transfer molding machine ("KTS-15", manufactured by Kohtaki Precision Machine Co., Ltd.), on the basis of JIS K 6911. The results are shown in Table 1. The unit in Table 1 is %.

(Spiral Flow)

In each of the examples and the comparative examples, spiral flow measurement was performed with respect to the obtained resin composition for encapsulating. The spiral flow measurement was performed by injecting the resin composition for encapsulating into a mold for measuring a spiral flow based on EMMI-1-66 under conditions of a mold temperature of 175° C., an injection pressure of 6.9 MPa, and a curing time of 120 seconds by using a low pressure transfer molding machine ("KTS-15", manufactured by Kohtaki Precision Machine Co., Ltd.), and by measuring a flow length. The results are shown in Table 1. The unit in Table 1 is cm.

(Gel Time)

In each of the examples and the comparative examples, a gel time of the obtained resin composition for encapsulating was measured. The gel time was measured by melting the resin composition for encapsulating on a heat plate which was heated to 175° C., and then, by measuring a time (the gel time) until the resin composition for encapsulating was cured while being mixed with a paddle. The results are shown in Table 1. The unit in Table 1 is second.

(Glass Transition Temperature)

In each of the examples and the comparative examples, a glass transition temperature (Tg) of a cured material of the obtained resin composition for encapsulating was measured as described below. First, the resin composition for encapsulating was subjected to injection molding under conditions of a mold temperature of 175° C., an injection pressure of 6.9 MPa, and a curing time of 120 seconds by using a low pressure transfer molding machine ("KTS-15", manufactured by Kohtaki Precision Machine Co., Ltd.), and thus, a sample piece of 10 mm×4 mm×4 mm was obtained. Next, the obtained sample piece was subjected to postcuring at 175° C. for 4 hours, and measurement was performed under conditions of a measurement temperature range of 0° C. to 320° C. and a temperature rising rate of 5° C./minute by using a thermomechanical analysis device (TMA100, manufactured by Seiko Instruments Inc.). Then, the glass transition temperature (Tg) was calculated from the measurement result. The results are shown in Table 1. The unit in Table 1 is ° C.

(Adhesiveness Evaluation)

In each of the examples and the comparative examples, adhesiveness of an encapsulating resin with respect to a substrate was evaluated as described below. First, a substrate (length 100 mm, width 80 mm) obtained by printing and curing a solder resist (DSR-2200S66-11, manufactured by Tamura Corporation) on a glass epoxy copper-clad laminated plate (R-1705, manufactured by Panasonic Corporation, a substrate thickness of 1.6 mm) was encapsulated and molded with the resin composition for encapsulating obtained as described above under conditions of a mold temperature of 175° C., an injection time of 20 seconds, an injection pressure of 8.4 MPa, and a curing time of 120 seconds by using a manual press YPS-120 ton, manufactured by IOWA Corporation, and thus, a molded material was obtained. An encapsulating resin portion of the molded material had a length of 90 mm, a width of 90 mm, and a thickness of 13 mm, and up to 85 mm of the length of the substrate was encapsulated in the encapsulating resin, and thus, 15 mm of the length of the substrate was exposed from one side. In addition, a resin thickness on the substrate on an upper surface side was 3.4 mm, and a resin thickness on the substrate on a lower surface side was 8 mm. Next, the molded material was immersed and cooled in 1 L of water at 25° C. for 20 minutes immediately after being taken off from the mold. Next, the cooled molded material was subjected to ultrasonic flaw detection by using FineSAT, manufactured by Hitachi Power Solutions Co., Ltd., and the presence or absence of delamination between the substrate and the encapsulating resin was observed. Here, a case where there was delamination was evaluated as C, and a case where there was no delamination was evaluated as B, and thus, the adhesiveness was evaluated. The results are shown in Table 1.

(Filling Property Evaluation)

In each of the examples and the comparative examples, the appearance of the molded body which had been subjected to the ultrasonic flaw detection in the adhesiveness evaluation described above was visually observed, and the presence or absence of an unfilled portion due to a weld was observed. Then, a case where there was the unfilled portion was evaluated as C, and a case where there was no unfilled portion was evaluated as B, and thus, filling properties were evaluated. The results are shown in Table 1.

(Filling Property Evaluation (Large))

In each of the examples and the comparative examples, filling property evaluation was performed with respect to a molded body larger than that in the filling property evaluation described above as described below. First, a substrate (a length of 130 mm and a width of 80 mm) obtained by printing and curing a solder resist (DSR-2200S66-11, manufactured by Tamura Corporation) on a glass epoxy copper-clad laminated plate (R-1705, manufactured by Panasonic Corporation, a substrate thickness of 1.6 mm) was encapsulated and molded with the resin composition for encapsulating obtained as described above under conditions of a mold temperature of 175° C., an injection time of 20 seconds, an injection pressure of 8.4 MPa, and a curing time of 120 seconds by using a manual press YPS-120 ton, manufactured by TOWA Corporation, and thus, a molded material was obtained. An encapsulating resin portion of the molded material had a length of 120 mm, a width of 90 mm, and a thickness of 9.6 mm, and up to 115 mm of the length of the substrate was encapsulated in an encapsulating resin, and thus, 15 mm of the length of the substrate was exposed from one side. In addition, both resin thicknesses on the substrate on an upper surface side and a lower surface side were 4 mm. The appearance of the obtained molded body was visually observed, and the presence or absence of an unfilled portion due to a weld was observed. Then, a case where there was the unfilled portion was greater than or equal to 1 mm was evaluated as C, a case where the unfilled portion was less than 1 mm was evaluated as B, and a case where there was no unfilled portion was evaluated as A, and thus, the filling properties were evaluated. The results are shown in Table 1.

(Temperature Cycle Test)

In each of the examples and the comparative examples, the molded body which had been subjected to the ultrasonic flaw detection in the adhesiveness evaluation described above was put into a temperature cycle test (−40° C. for 30 minutes, 125° C. for 30 minutes, and 1 cycle for 1 hour) in 1000 cycles, and then, was subjected the ultrasonic flaw detection again by using FineSAT, manufactured by Hitachi Power Solutions Co., Ltd. Then, the presence or absence of occurrence of new delamination or progress of the delamination was observed. Here, a case where there was the occurrence of the new delamination or the progress of the delamination was evaluated as C, and a case where there was no occurrence of the new delamination or no progress of the delamination was evaluated as B, and thus, the evaluation of the temperature cycle test was performed. The results are shown in Table 1.

TABLE 1

| | | | Example 1 | Example 2 | Example 3 | Example 4 | Example 5 | Example 6 | Example 7 | Comparative Example 1 | Comparative Example 2 | Comparative Example 3 |
|---|---|---|---|---|---|---|---|---|---|---|---|---|
| Resin Composition for Encapsulating | (A) Thermosetting Resin | Thermosetting Resin 1 | 12.7 | 12.7 | 12.7 | 12.7 | | 5.1 | 12.7 | 12.7 | | |
| | | Thermosetting Resin 2 | | | | | 11.1 | | | | 11.1 | |
| | | Thermosetting Resin 3 | | | | | | 5.1 | | | | 10.0 |
| | (B) Curing Agent | Curing Agent 1 | 6.4 | 6.4 | 6.3 | 6.3 | | | 6.3 | 6.3 | | |
| | | Curing Agent 2 | | | | | 8.0 | | | | 8.0 | |
| | | Curing Agent 3 | | | | | | 8.9 | | | | 9.1 |
| | (C) Curing Catalyst | Curing Catalyst 1 | 0.1 | 0.1 | 0.05 | 0.05 | 0.1 | 0.1 | | | 0.05 | 0.1 |
| | | Curing Catalyst 2 | | | | 0.1 | | | | 0.2 | | |
| | | Curing Catalyst 3 | | | | | 0.1 | | 0.2 | | 0.1 | |
| | (D) Inorganic Filler | Inorganic Filler 1 | 34.5 | | 34.5 | 34.5 | 34.5 | | 34.5 | 34.5 | 34.5 | 34.5 |
| | | Inorganic Filler 2 | 34.5 | 69 | 34.5 | 34.5 | 34.5 | 69 | 34.5 | 34.5 | 34.5 | 34.5 |
| | | Inorganic Filler 3 | 10 | 10 | 10 | 10 | 10 | 10 | 10 | 10 | 10 | 10 |
| | (E) Silane Coupling Agent | | 0.2 | 0.2 | 0.2 | 0.2 | 0.2 | 0.2 | 0.2 | 0.2 | 0.2 | 0.2 |
| | (F) Other Components | Oil | 0.5 | 0.5 | 0.5 | 0.5 | 0.5 | 0.5 | 0.5 | 0.5 | 0.5 | 0.5 |
| | | Low Stress Agent | 0.5 | 0.5 | 0.5 | 0.5 | 0.5 | 0.5 | 0.5 | 0.5 | 0.5 | 0.5 |
| | | Releasing Property Imparting Agent | 0.3 | 0.3 | 0.3 | 0.3 | 0.3 | 0.3 | 0.3 | 0.3 | 0.3 | 0.3 |
| | | Coloring Agent | 0.3 | 0.3 | 0.3 | 0.3 | 0.3 | 0.3 | | | | |
| Time $T_1$ (Second) | | | 21 | 21 | 23 | 23 | 77 | 27 | | | | |
| Time $T_2$ (Second) | | | 18 | 19 | 18 | 18 | 36 | 21 | | | | |
| Time $T_3$ (Second) | | | 3 | 4 | 3 | 4 | 4 | 2 | | | | |
| Minimum Torque Value (N · m) | | | 0.7 | 1.7 | 0.6 | 0.8 | 0.9 | 1.3 | | | | |
| Molding Shrinkage Factor (%) | | | 0.17 | 0.19 | 0.22 | 0.23 | 0.16 | 0.15 | | | | |
| Spiral Flow (cm) | | | 69 | 49 | 73 | 79 | 65 | 61 | | | | |
| Gel Time (Second) | | | 20 | 21 | 25 | 41 | 33 | 30 | | | | |
| Glass Transition Temperature (° C.) | | | 160 | 160 | 160 | 155 | 155 | 155 | | | | |
| Adhesiveness Evaluation | | | B | B | B | B | B | B | | | | |
| Filling Property Evaluation | | | B | B | B | B | B | B | | | | |
| Filling Property Evaluation (Large) | | | B | B | B | B | B | B | | | | |
| Temperature Cycle Test | | | B | B | B | B | B | B | | | | |

TABLE 1-continued

|  | | | | |
| --- | --- | --- | --- | --- |
| Coloring Agent | 0.3 | 0.3 | 0.3 | 0.3 |
| Time $T_1$ (Second) | 38 | 23 | 107 | 28 |
| Time $T_2$ (Second) | 15 | 18 | 46 | 22 |
| Time $T_3$ (Second) | 2 | 3 | 6 | 4 |
| Minimum Torque Value (N·m) | 0.5 | 0.5 | 0.9 | 0.3 |
| Molding Shrinkage Factor (%) | 0.18 | 0.27 | 0.17 | 0.16 |
| Spiral Flow (cm) | 87 | 76 | 72 | 115 |
| Gel Time (Second) | 27 | 25 | 57 | 32 |
| Glass Transition Temperature (° C.) | 160 | 155 | 160 | 152 |
| Adhesiveness Evaluation | B | C | B | B |
| Filling Property Evaluation | B | B | C | C |
| Filling Property Evaluation (Large) | A | B | C | C |
| Temperature Cycle Test | B | C | B | B |

This application claims priority on the basis of Japanese Patent Application No. 2015-043851, filed on Mar. 5, 2015, and the entire disclosure thereof is incorporated herein.

The present invention also can include the following aspects.

(1)

A resin composition for encapsulating which is used for forming an encapsulating resin of an on-vehicle electronic control unit including a wiring substrate, a plurality of electronic components mounted over the wiring substrate, and the encapsulating resin encapsulating the electronic component, the resin composition including: a thermosetting resin; and imidazoles, in which glass transition temperature of a cured material obtained by being heated at 175° C. for 4 hours is higher than or equal to 150° C., and when a torque value is measured over time under conditions of the number of rotations of 30 rpm and a measurement temperature of 175° C. by using Labo Plastomill, a time $T_1$ at which the torque value is less than or equal to 2 times a minimum torque value is longer than or equal to 15 seconds and shorter than or equal to 100 seconds, and the minimum torque value is greater than or equal to 0.5 N·m and less than or equal to 2.5 N·m.

(2)

The resin composition for encapsulating according to (1), in which a molding shrinkage factor measured on the basis of JIS K 6911 is less than or equal to 0.4%.

(3)

The resin composition for encapsulating according to (1) or (2), in which when the torque value is measured over time under the conditions of the number of rotations of 30 rpm and a measurement temperature of 175° C. by using Labo Plastomill, a time $T_2$ from start of measurement until reaching the minimum torque value is longer than or equal to 5 seconds and shorter than or equal to 40 seconds.

(4)

The resin composition for encapsulating according to any one of (1) to (3), further containing an inorganic filler.

(5)

The resin composition for encapsulating according to (4), in which the inorganic filler contains spherical silica and crushed silica.

(6)

The resin composition for encapsulating according to any one of (1) to (5), in which when the torque value is measured over time under the conditions of the number of rotations of 30 rpm and a measurement temperature of 175° C. by using Labo Plastomill, a time $T_3$ from a point at which the torque value becomes 3 N·m after the minimum torque value to a point at which the torque value becomes 6 N·m is longer than or equal to 2 seconds and shorter than or equal to 20 seconds.

(7)

A manufacturing method of an on-vehicle electronic control unit, including: a step of mounting a plurality of electronic components over at least one surface of a wiring substrate; and a step of encapsulating and molding the plurality of electronic components by using the resin composition for encapsulating according to any one of (1) to (6).

(8)

The manufacturing method of an on-vehicle electronic control unit according to (7), in which the wiring substrate includes a solder resist layer which is formed of a resin composition containing a silicone compound over the one surface.

(9)

The manufacturing method of an on-vehicle electronic control unit according to (7) or (8), in which in the step of mounting the plurality of electronic components, the plurality of electronic components are mounted over each of the one surface of the wiring substrate and the other surface on a side opposite to the one surface.

(10)

The manufacturing method of an on-vehicle electronic control unit according to any one of (7) to (9), in which in the step of encapsulating and molding the plurality of electronic components, a part or all of the wiring substrate is encapsulated by using the resin composition for encapsulating, along with the plurality of electronic components.

(11)

An on-vehicle electronic control unit, including: a wiring substrate; a plurality of electronic components which are mounted over at least one surface of the wiring substrate; and an encapsulating resin which is formed by curing the resin composition for encapsulating according to any one of (1) to (6) and encapsulates the electronic component.

(12)

The on-vehicle electronic control unit according to (11), in which the wiring substrate includes a solder resist layer which is formed of a resin composition containing a silicone compound over the one surface.

(13)

The on-vehicle electronic control unit according to (11) or (12), in which the plurality of electronic components are mounted over each of the one surface of the wiring substrate and the other surface on a side opposite to the one surface.

The invention claimed is:

1. A resin composition for encapsulating which is used for forming an encapsulating resin of an on-vehicle electronic control unit including a wiring substrate, a plurality of electronic components mounted over the wiring substrate, and the encapsulating resin encapsulating the electronic component, the resin composition comprising:

a thermosetting resin; and
one or more imidazole compounds,
wherein when a torque value is measured over time under conditions of the number of rotations of 30 rpm and a measurement temperature of 175° C. by using Labo Plastomill, a time $T_1$ at which the torque value is less than or equal to 2 times a minimum torque value is longer than or equal to 15 seconds and shorter than or equal to 100 seconds, and the minimum torque value is greater than or equal to 0.5 N·m and less than or equal to 2.5 N·m.

2. The resin composition for encapsulating according to claim 1,
wherein a glass transition temperature of a cured material obtained by heating the resin composition for encapsulating at 175° C. for 4 hours is higher than or equal to 130° C. and lower than or equal to 300° C.

3. The resin composition for encapsulating according to claim 1,
wherein a molding shrinkage factor which is measured on the basis of JIS K 6911 is more than or equal to 0% and less than or equal to 0.4%.

4. The resin composition for encapsulating according to claim 1,
wherein when the torque value is measured over time under the conditions of the number of rotations of 30 rpm and a measurement temperature of 175° C. by using Labo Plastomill, a time $T_2$ from start of measurement until reaching the minimum torque value is longer than or equal to 5 seconds and shorter than or equal to 40 seconds.

5. The resin composition for encapsulating according to claim 1, further containing:
an inorganic filler.

6. The resin composition for encapsulating according to claim 5,
wherein the inorganic filler contains spherical silica and crushed silica.

7. The resin composition for encapsulating according to claim 1,
wherein when the torque value is measured over time under the conditions of the number of rotations of 30 rpm and a measurement temperature of 175° C. by using Labo Plastomill, a time $T_3$ from a point at which the torque value becomes 3 N·m after the minimum torque value to a point at which the torque value becomes 6 N·m is longer than or equal to 2 seconds and shorter than or equal to 20 seconds.

8. A manufacturing method of an on-vehicle electronic control unit, comprising:
a step of mounting a plurality of electronic components over at least one surface of a wiring substrate; and
a step of encapsulating and molding the plurality of electronic components by using the resin composition for encapsulating according to claim 1.

9. The manufacturing method of an on-vehicle electronic control unit according to claim 8,
wherein the wiring substrate includes a solder resist layer which is formed of a resin composition containing a silicone compound over the one surface.

10. The manufacturing method of an on-vehicle electronic control unit according to claim 8,
wherein in the step of mounting the plurality of electronic components, the plurality of electronic components are mounted over each of the one surface of the wiring substrate and the other surface on a side opposite to the one surface.

11. The manufacturing method of an on-vehicle electronic control unit according to claim 8,
wherein in the step of encapsulating and molding the plurality of electronic components, a part or all of the wiring substrate is encapsulated by using the resin composition for encapsulating, along with the plurality of electronic components.

12. An on-vehicle electronic control unit, comprising:
a wiring substrate;
a plurality of electronic components which are mounted over at least one surface of the wiring substrate; and
an encapsulating resin which is formed by curing the resin composition for encapsulating according to claim 1 and encapsulates the electronic component.

13. The on-vehicle electronic control unit according to claim 12,
wherein the wiring substrate includes a solder resist layer which is formed of a resin composition containing a silicone compound over the one surface.

14. The on-vehicle electronic control unit according to claim 12,
wherein the plurality of electronic components are mounted over each of the one surface of the wiring substrate and the other surface on a side opposite to the one surface.

* * * * *